United States Patent [19]

Kucukcakar et al.

[11] Patent Number: 5,912,819
[45] Date of Patent: Jun. 15, 1999

[54] METHOD FOR DESIGNING AN ARCHITECTURAL SYSTEM

[75] Inventors: Kayhan Kucukcakar, Cave Creek; Chih-Tung Chen, Chandler; Wilhelmus J. Philipsen; Thomas E. Tkacik, both of Phoenix, all of Ariz.

[73] Assignee: Motorola, Inc., Schaumburg, Ill.

[21] Appl. No.: 08/758,331

[22] Filed: Dec. 3, 1996

[51] Int. Cl.[6] .................................................. G06F 17/50
[52] U.S. Cl. .......................... 364/488; 364/489; 364/490; 364/491; 364/578
[58] Field of Search ................................... 364/488, 489, 364/490, 491, 578

[56] References Cited

U.S. PATENT DOCUMENTS 5,555,201  9/1996  Dangelo et al. ......................... 364/489

Primary Examiner—Kevin J. Teska
Assistant Examiner—Thuan Do
Attorney, Agent, or Firm—Robert D. Atkins

[57] ABSTRACT

A computer implemented architectural design method for designing an integrated circuit. An algorithmic description of the behavior of the integrated circuit is created (step 202), from which a register transfer logic (RTL) implementation (400, 500) of the integrated circuit is generated by performing a set of design tasks (steps 204–212). The RTL implementation is modified after performing one of the design tasks by branching to another design task such that the design tasks are performed in any order. Data is stored in a common database (12) which can be edited interactively through one of a plurality of data editors (14–22).

30 Claims, 4 Drawing Sheets

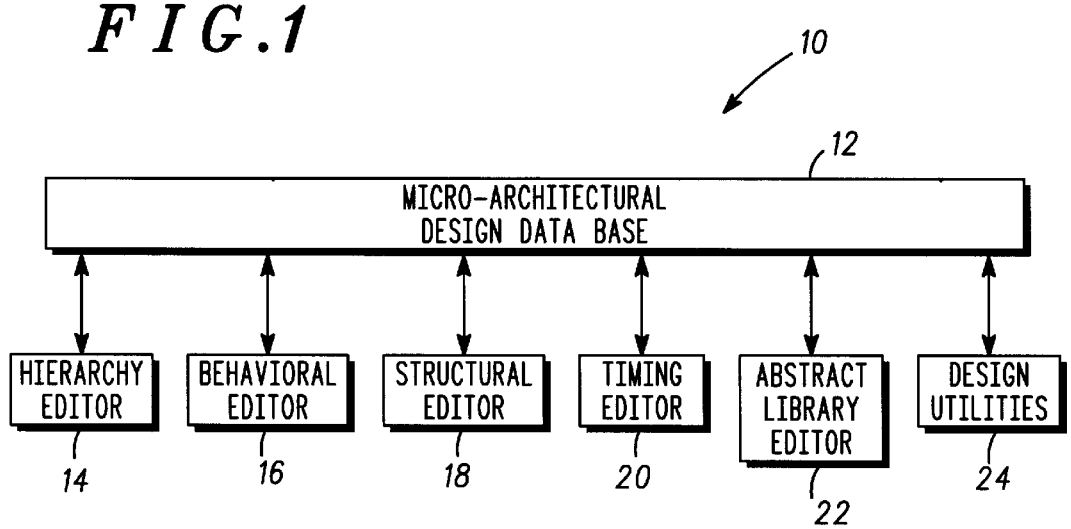
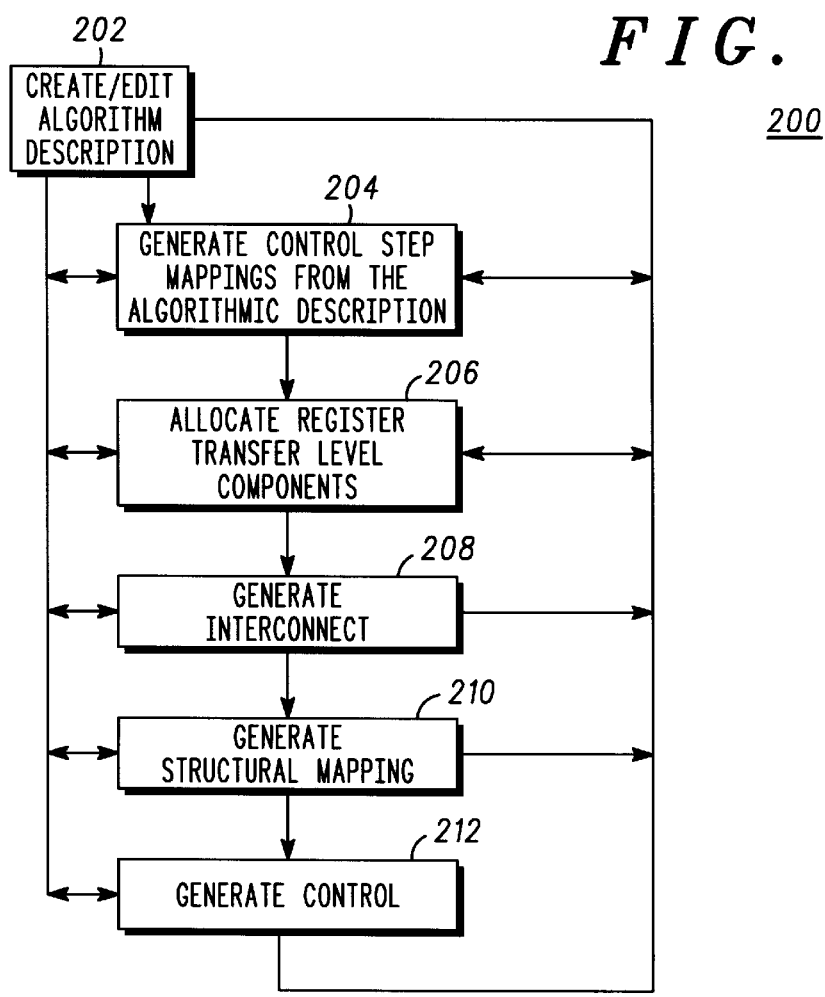

METHOD FOR DESIGNING AN ARCHITECTURAL SYSTEM

CROSS REFERENCE TO RELATED PATENT APPLICATIONS

The present application is related to copending U.S. patent application Ser. No. 08/333,656, U.S. Pat. No. 5,600,567, entitled "Method of Graphically displaying and Manipulating Clock-Based Scheduling of HDL Statements", filed Nov. 3, 1994, by "Kucukcakar, et al., and assigned to the same assignee, Motorola Inc;" and issued U.S. Pat. No. 5,533,179, entitled "Apparatus and Method of Modifying Hardware Description Language Statements," by Kucukcakar, et al., and assigned to the same assignee, Motorola Inc.

BACKGROUND OF THE INVENTION

The present invention relates to integrated circuit design methods and, in particular, to an interactive method for designing integrated circuit architectures.

The complexity of modern integrated circuits has led to the development of architecture-based designs which use higher level synthesis methods to decrease design cycle time. For example, a typical high level synthesis method uses an algorithmic description of the behavior of the integrated circuit to generate a register transfer level (RTL) hardware implementation of the circuit. The method includes a series of design tasks such as scheduling, resource allocation, binding (mapping a behavioral statement to a specific hardware component), and controller generation. These design tasks are highly interdependent to a level of complexity which is comparable to the complexity of the integrated circuit being designed.

Prior art methods for high level synthesis use an input consisting of a set of behavioral statements and constraints that describe the specified integrated circuit performance. The series of design tasks is automatically executed to provide a hardware implementation at the end. Each design task produces data whose relationship to the behavioral statements is increasingly difficult to perceive, so that a designer has difficulty in associating particular hardware components with specific statements in the behavioral description. If a design error is detected in the hardware implementation, the designer has difficulty in determining which behavioral statement to change. The low level of visibility between hardware components and behavioral statements often makes hardware optimization a trial and error process in which several iterations of the automated design tasks are required. A sizable portion of the design tasks is devoted to redundant calculations of portions of the integrated circuit which do not change from the previous iteration. The expenditure of computing resources is both time consuming and costly.

Hence, there is a need for an architectural design method which allows multiple interactions with data produced by each design task to increase the visibility between hardware and behavior for reducing design time and cost.

BRIEF DESCRIPTION OF THE DRAWINGS

FIG. 1 shows a block diagram of an interactive architectural design system;

FIG. 2 shows a flow chart of the interactive architectural design system;

DETAILED DESCRIPTION OF THE DRAWINGS

Figure 3:
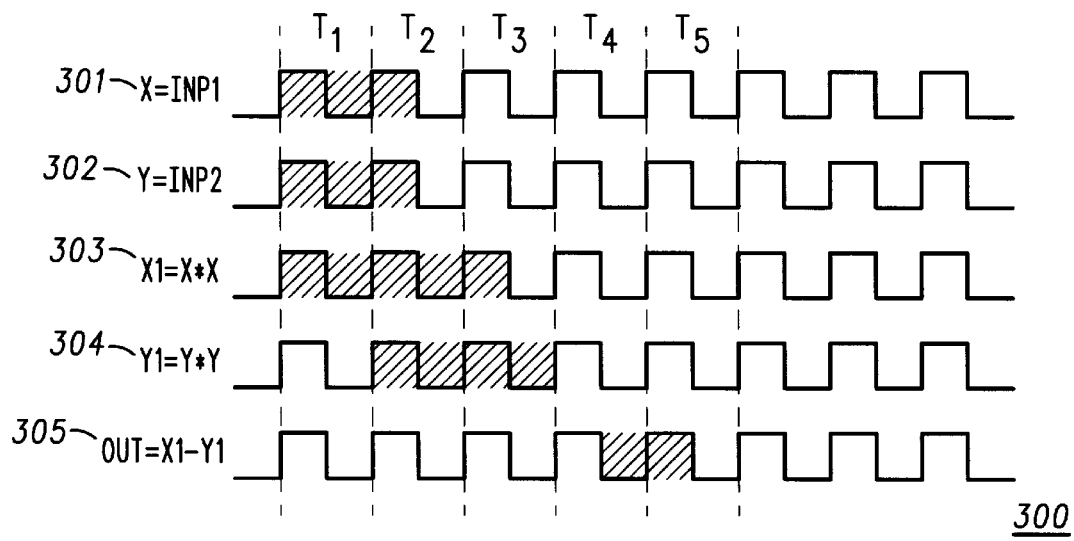
FIG. 3 shows a timing diagram of a control step mapping associated with an algorithmic description.

FIG. 1 shows a block diagram of an interactive architectural design system 10 comprising multiple, intuitive and complementary editors, each of which controls a different design task. A micro-architectural design database 12 includes memory which stores data of varying types in a common database. For example, behavioral, structural and timing data types which are representative of the integrated circuit are stored in micro-architectural design database 12. Data is accessible for either reading or writing by a hierarchy editor 14, a behavioral editor 16, a structural editor 18, a timing editor 20, an abstract library editor 22 and design utilities 24. Data stored in micro-architectural design database 12 is stored in a predetermined format which is understood by each of the editors and design utilities 24.

A hierarchy editor 14 is used for partitioning an integrated circuit design into hierarchical blocks. A designer typically partitions the circuit based on the design specification and the behavioral complexity of particular blocks. For example, a digital signal processing (DSP) core that interfaces with a bus can be further partitioned into bus interface block and a DSP core block. Data generated in hierarchy editor 14 is stored in micro-architectural design database 12 for further processing. Hierarchical data from micro-architectural design database 12 is recalled through a graphical interface of hierarchy editor 14 for viewing or for repartitioning particular blocks.

Data for describing the algorithmic behavior of individual blocks defined by hierarchy editor 14 is stored in micro-architectural design database 12. Behavioral data is retrieved and arranged in a graphical or textual format for viewing on a display device. Because behavioral data is entered as a series of statements defining specific functions or operations, behavioral editor 16 typically has built-in syntax checking. Behavioral data is typically provided after partitioned blocks have been defined in hierarchy editor 14.

Structural editor 18 manages register transfer level (RTL) data stored in micro-architectural design database 12. RTL data represents hardware components of partitioned blocks produced in hierarchy editor 14. RTL data either is provided or edited by a designer interactively or is generated by a utility in design utilities 24 using data existing in micro-architectural design database 12. RTL data is arranged in a graphical or textual format for displaying as a schematic diagram through a graphical interface in structural editor 18.

Timing editor 20 provides an editing environment for the cycle-based timing of behavioral statements created in behavioral editor 16. Timing data is stored in micro-architectural design database 12 and either is provided by a designer interactively or is generated by a utility in design utilities 24. Timing editor 20 includes a graphical interface for displaying timing data in a graphical or textual format for viewing and for arranging relative scheduling of the algorithmic description.

Abstract library editor 22 provides an environment for accessing, editing or creating RTL library components. RTL library components are stored in micro-architectural design database 12. Data for a library component includes attributes of a RTL component such as delays, clocking methods and the like. Data of a library component is accessed through the graphical interface of abstract library editor 18 for interactive viewing and editing.

Design utilities 24 includes executable programs used by architectural design system 10 to automate particular design tasks. For example, design utilities 24 includes a utility which generates cycle-based scheduling of behavioral statements. The scheduling is viewed through timing editor 20 as timing diagrams associated with behavioral statements. Another utility in design utilities 24 generates the RTL structure of partitioned blocks whose schematic diagrams are viewed and edited in structural editor 18. Data which is generated automatically by a utility in design utilities 24 can be interactively modified by a designer using the appropriate editor.

An important utility included in design utilities 24 is a controller generator which generates a control unit comprising a state machine that asserts a control signal to a RTL component at a specified time for implementing the specified behavior and timing. Controller generation is typically automatic and performed as the last step in the design process.

FIG. 2 shows a design flow diagram of micro-architectural design system 10 comprising steps 202 through 212, which are configured for performing in different orders by executing one of the steps and branching any other step. At step 202, a behavioral or algorithmic description is created or edited for each block partitioned by hierarchy editor 14. Behavioral data is entered through behavioral editor 16 as a set of operations or function statements typically written in a text-based programming language such as C language. Behavioral data also can be entered graphically using flow diagrams. The algorithmic description is viewed or edited through a graphical interface in behavioral editor 16.

At step 204, control steps are mapped from the algorithmic description of the partitioned block to particular cycles of a system clock. Control step mapping is defined as a process of linking behavioral statements to particular clock cycles during which the behavioral statements are to be performed. Control steps describe the cycle-based timing for performing the functions or operations defined by the behavioral statements. A timing diagram showing the control steps is viewed or edited in timing editor 20.

At step 206, the RTL components are allocated in accordance with the design specification. The quantity of each type of RTL component to be used in implementing a design is determined according to the result of control step mapping (step 204). The current RTL component allocation is stored in micro-architectural design database 12 and examined by using structural editor 18. Limits on the quantity of particular RTL components to be used in a design are often imposed by the design specification. To incorporate the limits into the design data, RTL component data is retrieved in structural editor 18 and interactively edited to modify the current RTL component allocation.

Interconnection of RTL components (step 208) can be generated automatically by executing an interconnect utility included in design utilities 24. The interconnect utility can create a completely new interconnect structure or can add new interconnect to an existing incomplete interconnect structure. Alternatively, all or a portion of the interconnect is provided interactively by the designer using structural editor 18 to view and modify the current interconnect. Interconnection step 208 includes generating the conductors which carry signals among the current RTL components. In addition, switching devices such as multiplexers and tri-state drivers, which are needed for implementing RTL component sharing and communication protocol, are produced at interconnection step 208. The conductors and switching devices are generated according to the design specification while taking into account constraints introduced by the control step mapping and behavioral to structural mapping steps 204 and 210. Interconnect data is stored in micro-architectural design database 12.

Structural mapping (step 210) associates variables and operations in the behavioral description of a block with specific RTL components. Thus, algorithmic or behavioral statements viewed and edited in behavioral editor 16 are linked to RTL components viewed and edited in structural editor 18. RTL components and behavioral statements can be viewed simultaneously in a display device. When particular RTL components are selected in one area of the display, the associated behavioral statements are highlighted in another display area to more clearly show the link between behavioral statements and RTL components. These links enable the controller generator utility (step 212) to produce a control unit which implements the specified behavior, timing and resource allocation of the design. A mapping utility in design utilities 24 automatically generates links between behavioral statements and specific RTL components. Alternatively, particular RTL components can be specified to perform particular behavioral operations by using structural editor 18 and behavioral editor 16 interactively to define the desired links to achieve design-specific component utilization.

By providing a user interface for each of the editors in architectural design system 10, the present method allows a designer to view and/or modify data generated by each design task at each stage in a design. During an original design, steps 202 through 212 are often performed sequentially, either automatically or interactively. Under certain conditions, the sequential execution of steps 202 through 212 is adequate when a new design is initiated from scratch.

However, a significant portion of design activity is dedicated to modifying or adapting an existing RTL implementation to conform to a new specification. Such modifications or adaptations often require changing only a portion of the existing RTL implementation. Prior art design systems execute steps 202 through 212 sequentially, thereby treating the modifications as if they were original designs. Any change requires the designer to restart from the beginning at step 202. Design and computing resources are thereby wasted in redundant calculations pertaining to portions of the RTL implementation which do not change. Moreover, the designer cannot prevent the prior art design system from changing portions of the implementation which need to be reused.

One feature of architectural design system 10 is the common database for storing design data which is provided in micro-architectural design database 12. Because each editor accesses and interprets the same design data, consistency among the behavioral, timing, structural and mapping types of design data is ensured. Micro-architectural design database 12 includes one or more tables which maintain the attributes of each design data element. The attributes are added to or deleted from the table by each of the steps 202–210. For example, if the designer modifies a particular control step mapping of a behavioral statement, the existing control step mapping of the statement is deleted from the table and the new mapping is added. The attributes in the table that did not change remain intact. Thus, only the attributes that changed are updated in a subsequent execution of the design tasks of steps 202–210. In an alternate embodiment, a flag or other indicator can be use to track which attributes change. U.S. Pat. No. 5,533,179 discloses an example of modifying only that attributes that change.

Each editor has a user interface which allows the designer to decide which design tasks are to be performed and on what portion of the design. Each editor can access the common database at any step in the design to provide reliable interactive editing of the design data, such that design tasks need not be performed in any specific order. For example, the designer can first perform step 206 and then sequentially branch to steps 208, 202, 204, 210 and 212 in that order.

Another feature of architectural design system 10 is that design tasks related to unchanged design data need not be repeated. In particular, utilities in design utilities 24 are associated with each editor which allow the designer to select and control those portions of the design on which to perform particular design tasks. As a result, portions of the design which do not change are not recalculated. By eliminating unneeded or redundant design tasks, design and computing resources are more efficiently utilized.

The advantages of the alternative ordering of design tasks can be understood by an example where an existing integrated circuit design is modified for use in different applications. The existing design is first partitioned into fixed and programmable portions in hierarchy editor 14, such that the fixed portion is reused in the different applications, while only the programmable portion is varied. In such a partitioned system, the steps 206 and 208 are executed first to allocate and interconnect the RTL components included in the fixed portion. Step 202 is then executed to define a particular behavior according to the design specification of the particular application. Next, the programmable portion is generated by executing steps 204 and 210 to set the control step and structural mappings to complete the database. Finally, the control unit is generated at step 212.

Another example of the advantage of performing design tasks in an alternative order is seen when a new instruction is added to an existing microprocessor designed using the method of the present invention and whose database is present in micro-architectural design database 12. Prior art methods require executing the design tasks in order from step 202 through step 212 to effect a complete redesign of the microprocessor. The prior art approach is inefficient, particularly where significant portions of the existing microprocessor have previously been subjected to extensive debugging and optimization.

The present method allows the designer to preserve the previously optimized portions if they are not affected by the new instruction. The utilities in design utilities 24 have a select mode in which a utility operates only on data which has been selected by the designer using one of the editors. In the example of adding a new instruction to an existing microprocessor, the designer selects the portion of the microprocessor which is needed for implementing the new instruction. The appropriate utility is executed in the select mode to modify only the portion selected by the designer.

For example, behavioral statements describing the new instruction are added to the algorithmic description of the existing microprocessor at step 202 using behavioral editor 16. The new behavioral statements are interactively identified and selected by the designer through the user interface of behavioral editor 16. Step 204 is executed in the select mode to map the selected statements into control steps. Assuming no additional RTL components are required to implement the added instruction, step 210 is executed such that only the selected new behavioral statements are mapped to the existing RTL implementation. The design is completed by executing step 212 to generate a new controller which enables the existing RTL architecture to implement the modified instruction set. In this case, the new design is implemented by executing only steps 202, 204, 210 and 212, while preserving previously optimized and debugged portions of the microprocessor.

The procedures for creating and editing a design database using the present invention are seen by way of an example in which a circuit is designed which computes a difference of squares function of two values applied at inputs INP1 and INP2, respectively. Using behavioral editor 16, an algorithmic description of the desired function is provided (step 202) which comprises behavioral statements 1 through 5 shown in Table 1 below.

Table 1

| | |
|---|---:|
| X=INP1 | 1. |
| Y=INP2 | 2. |
| X1=X*X | 3. |
| Y1=Y*Y | 4. |
| OUT=X1-Y1 | 5. |

Once the algorithmic description is entered into the design database, the RTL implementation is generated automatically by performing steps 204 through 212 in accordance with design constraints imposed on particular design tasks. Alternatively, the designer can interactively customize particular aspects of the algorithmic description and RTL implementation. For example, assume the designer interactively constrains the RTL implementation to provide an output every fourth cycle and to use a single two-cycle pipelined multiplier circuit. Control step mapping is first completed by executing step 204, followed by RTL component allocation at step 206.

FIG. 3 is a timing diagram 300 showing the control step mapping for the algorithmic statements of Table 1. For clarity, cycles of a system clock during which each statement is executed are shaded. Waveforms 301 and 302 show input values X and Y being received at inputs INP1 and INP2, respectively, during cycle $T_1$. Waveform 303 indicates that the multiplication X1=X*X is performed during cycles $T_1$ and $T_2$, and waveform 304 indicates that the multiplication Y1=Y*Y is performed during cycles $T_2$ and $T_3$. Waveforms 302 and 303 overlap during cycle $T_2$ because the same two-cycle pipelined multiplier performs both multiplications. Waveform 305 shows output value OUT=X1-Y1 being generated during cycle $T_4$ because of the fourth-cycle constraint imposed by the designer.

Once the control step mapping is concluded, step 206 is performed interactively by specifying particular RTL components, such as the single two-cycle pipelined multiplier, using structural editor 18. A required subtractor circuit and two registers for storing intermediate values Y, X1 and Y1 are also allocated interactively. As an alternative procedure, the RTL implementation can be completed automatically by performing steps 206 through 212 using utilities associated with each step from design utilities 24.

Assuming the pipelined multiplier, the subtractor and the two registers are allocated interactively, the structural mapping (step 210) is often performed before the interconnect is generated (step 208) to link specific RTL components allocated at step 206 to particular algorithmic operations. For example, the pipelined multiplier allocated at step 206 is mapped to the multiplication operations of behavioral statements 3 and 4 of Table 1. Similarly, the subtraction operation of behavioral statement 5 of Table 1 can be linked to the subtractor circuit allocated at step 206, and intermediate values Y, X1 and Y1 can be mapped to particular registers allocated at step 206.

After the behavioral description, the control step mapping, the RTL component allocation, and the structural mapping are satisfactorily completed, the interconnection and the control unit are generated automatically (steps 208, 212) to complete the RTL implementation It can be seen from the above examples that the method of the present invention does not require a strict execution of steps 202 through 212 in the order shown in FIG. 2, but rather allows the designer to branch from one step to any other step in order to most effectively complete the integrated circuit design. For example, in the above described procedure step 210 was performed prior to step 208.

Figure 4:
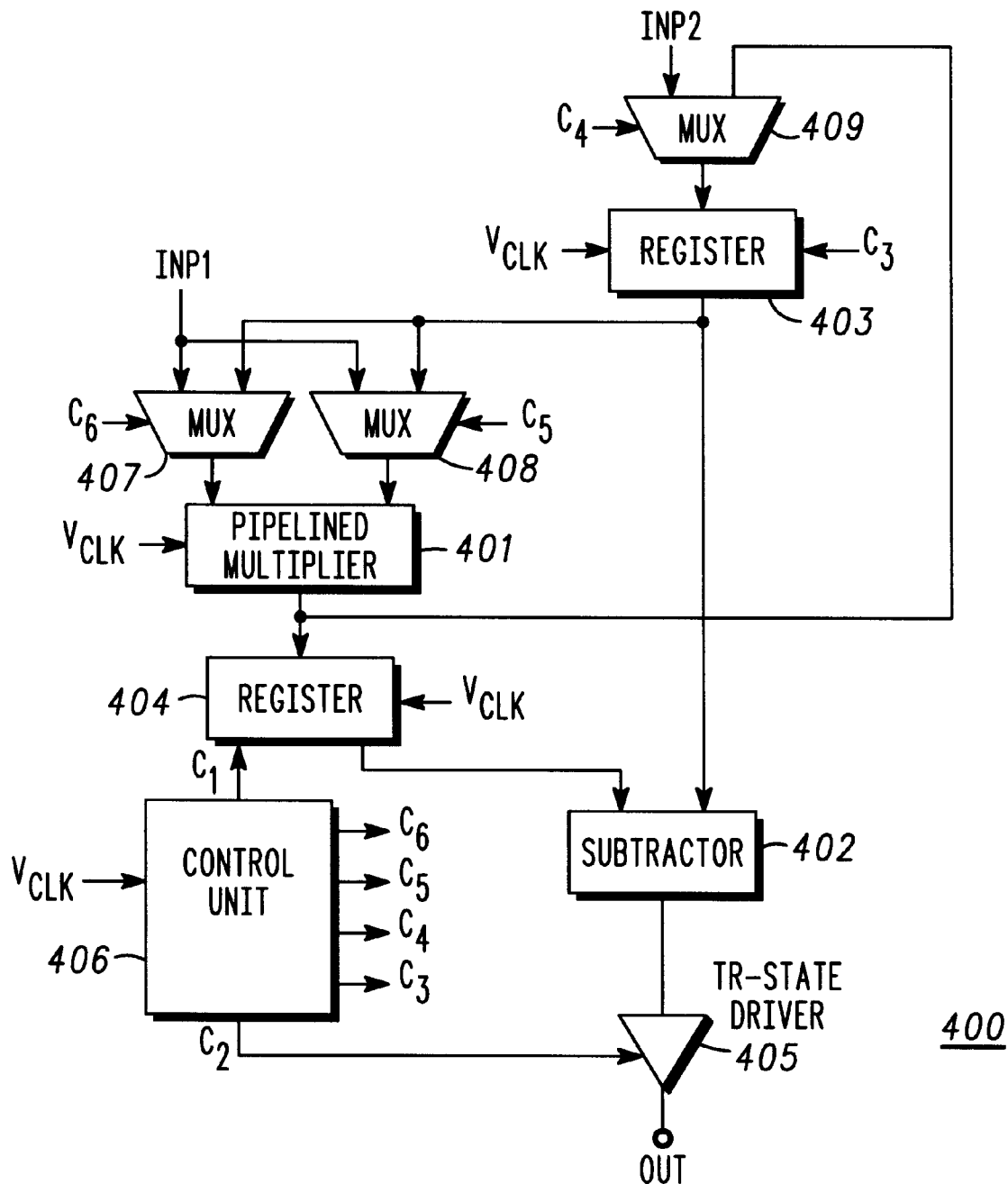
FIG. 4 shows a schematic diagram of a hardware implementation of the algorithmic description.

FIG. 4 is a schematic diagram showing an exemplar RTL implementation 400 of behavioral statements 1 through 5 of Table 1, as constrained by the timing shown in timing diagram 300, in an integrated circuit embodiment. RTL implementation 400 includes a pipelined multiplier 401, a subtractor 402, registers 403 and 404, a tri-state driver 405, a control unit 406 and multiplexers 407, 408 and 409. An input INP1 receives a value X and an input INP2 receives a value Y. An output provides a computed result OUT=$X^2-Y^2$ in accordance with the algorithm defined by behavioral statements 1 through 5 of Table 1. Cycle timing is provided by a system clock $V_{clk}$.

RTL components are allocated in accordance with the above described steps implementing the present invention. In particular, pipelined multiplier 401 is allocated interactively at step 206 to perform the multiplication operations of behavioral statements 3 and 4 of Table 1. Similarly, subtractor 402 is allocated interactively at step 206 to perform the subtraction function of statement 5 of Table 1. Registers 403 and 404 are allocated at step 206 to store intermediate values Y, X1 and Y1 of Table 1. Interconnection conductors and multiplexers 407–409 are generated automatically at step 208.

Control unit 406 is generated automatically to provide control signals $C_1$–$C_6$ to particular components for implementing the specified algorithmic description and timing. For example, tri-state driver 405 has a control input which receives control signal $C_2$ during cycle $T_4$ from control unit 406 to provide the computed result OUT to the output or to set tri-state driver 405 in a tri-state mode.

Figure 5:
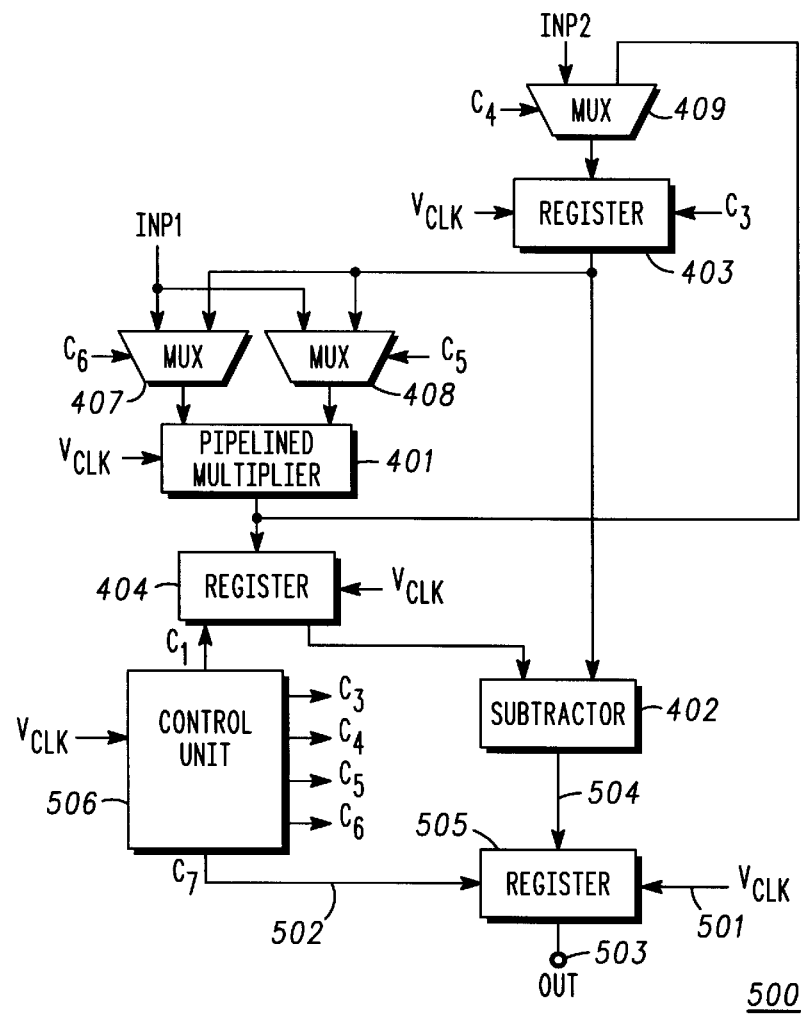
FIG. 5 shows a schematic diagram of a hardware implementation of a modified algorithmic description.

FIG. 5 is a schematic diagram showing a RTL implementation 500 of statements 1–5 of Table 1 in which a design specification change requires the computed result OUT to be stored and displayed at the output for four clock cycles. Using the existing database of RTL implementation 400 of FIG. 4 as a starting point, it can be seen that the specification change is implemented by allocating a new register 505 to replace the tri-state driver 405 of RTL implementation 400. Accordingly, the designer proceeds directly to step 206 to interactively delete tri-state driver 405 from the database and allocate register 505 using structural editor 18. Such a direct entry for branching to a particular design task improves design efficiency because steps 202 and 204, which are not changed, can be bypassed.

At step 208, register 505 is interconnected to subtractor 402 by adding conductor 504 using the structural editor 18. Similarly, conductors 501–503 are interactively created or modified from the existing database using structural editor 18. Note that only the modified portions of RTL implementation 500 need to be edited at steps 206 and 208. Subsequent operations can be performed in a select mode such that only data representative of the selected new elements is recalculated. The remaining RTL components, which do not change, remain in the database and are reused in RTL implementation 500. Structural mapping (step 210) for a relatively small and localized modification is typically performed interactively to specify that computed result OUT= $X^2-Y^2$ be stored in register 505.

Even though step 212 was previously run to automatically generate control unit 406 in RTL implementation 400, step 212 is re-executed to generate control unit 506 because a different function is performed. In particular, control unit 406 enables tri-state driver 405 during cycle $T_4$, whereas control unit 506 provides a control signal $C_7$ on conductor 502 to register 505 for storing computed result OUT at clock cycle $T_4$ until the next control signal $C_7$ is asserted.

The above examples show how the designer can interactively override data in micro-architectural design database 12 to modify RTL components to produce RTL implementations 400 and 500 which have different structures. The structural difference was produced by using structural editor 18 to interactively modify particular RTL components and interconnect without modifying statements in the algorithmic description. Specifically, register 505 and conductors 501–504 were interactively added to the design database by using structural editor 18 to modify RTL implementation 400 and then branching to other design tasks to complete the design of RTL implementation 500.

The present invention can also produce a RTL implementation which is structurally distinct from a circuit produced using prior art methods. For example, a prior art design method can produce a schematic representation of a circuit which implements a similar function as described by the behavioral statements shown in Table 1. A prior art design program is executed using the behavioral statements as input data and data representative of the circuit schematic is produced at the output. The output data results in an implementation having a specific structure characteristic of the particular prior art design program.

In contrast, the RTL implementation produced using the present invention has a structure which is not limited by a particular program, but rather can be modified and optimized by the designer. The designer branches to an appropriate step in the process to interactively modify the design database. More particularly, the designer can branch to structural editor 18 to interactively modify the RTL components and interconnect without modifying statements in the algorithmic description, as described above. As a result, a design can be modified to produce a RTL implementation whose structure is different from the structure produced by prior art methods.

A RTL implementation typically comprises a schematic diagram of an integrated circuit. Data generated from such a schematic diagram is used to produce photomasks for fabricating physical structures of the RTL implementation on a semiconductor substrate to produce an integrated circuit. The present design method for producing a RTL implementation comprises a design portion of a manufacturing process for fabricating an integrated circuit which includes the RTL implementation.

Figure 6:
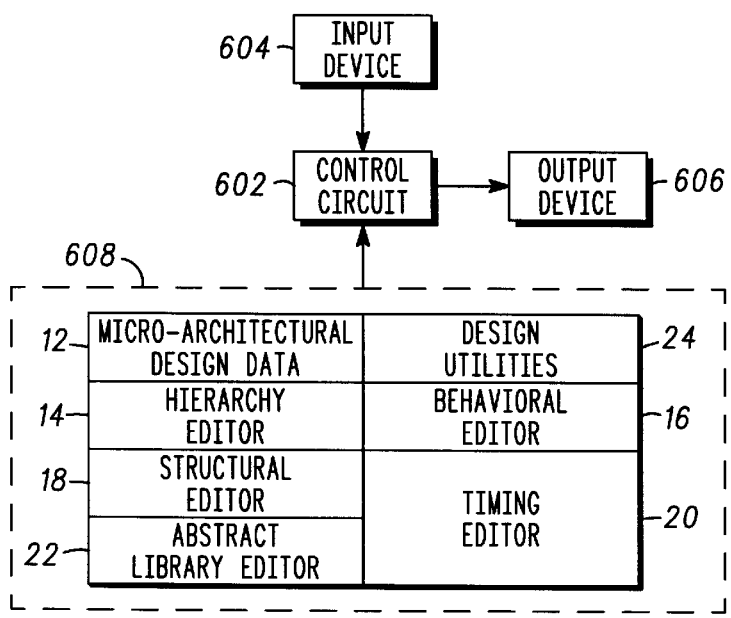
FIG. 6 shows a block diagram of a computer for implementing the interactive architectural design system.

FIG. 6 shows a block diagram of a computer 600 used to design an integrated circuit with architectural design system 10, including a control circuit 602, an input device 604, an output device 606 and a memory 608. Input device 604 provides a means for entering input data into computer 600. Where data is entered interactively by a designer, input device 604 typically includes a keyboard. However, input device 604 can also comprise other types of input devices such as disks or tape drives, modems or scanning devices. Input data is coupled from input device 604 to control circuit 602, which executes one of the editing programs stored in memory 608 that determines how the input data is processed.

Output device 606 typically includes a display monitor for interactively displaying data received from control circuit 602 which is representative of the integrated circuit architectural system being designed. Output device 606 can include other types of devices which display or transfer data which is generated or stored in computer 600, such as printers, modems and disk or tape drives.

Control circuit 602 executes software programs stored in memory 608 for implementing design tasks included in architectural design system 10. The design tasks are performed automatically by executing one of the utility programs stored in the region in memory 608 provided for storing design utilities 24. Control circuit 602 typically comprises a microprocessor, but the functions of control circuit 602 can be provided by other types of logic circuits including state machines. Control circuit 602 also executes editing programs stored in memory 608 which provide a graphical interface between computer 600 and the designer who performs design tasks interactively. Such editing programs include hierarchy editor 14, behavioral editor 16, structural editor 18, timing editor 20 and abstract library editor 22.

Control circuit 602 manages the flow of data internal to computer 600 as well as input data received from input device 604 and display data transferred to output device 606. Control circuit 602 retrieves, modifies and stores data saved in a common design database of memory 608 designated as micro-architectural design database 12, under the direction of a utility program or an editor.

Memory 608 includes the above described plurality of memory regions for storing data and software programs used to implement architectural design system 10. Memory 608 can include random-access memory, read-only memory, magnetic storage media such as floppy disks, hard disks and magnetic tape, optical storage media such as compact disks, and similar memory devices.

By now it should be appreciated that a computer implemented architectural design method is provided for designing an integrated circuit. An algorithmic description of the integrated circuit are provided and a RTL implementation of the integrated circuit is generated from the algorithmic description of the architectural system by performing a set of design tasks. The design tasks need not be performed in a particular sequence. Rather, the designer can interactively branch from one design task to any other design task to complete the design tasks in any appropriate order.

The architectural design method further allows a designer to interactively modify an existing RTL implementation more efficiently by proceeding directly to the appropriate step and making desired changes interactively through the user interface of the editor associated with that step. The designer identifies the modified portion interactively and completes the modified RTL implementation by interactively branching to other steps in any order to perform design tasks on only the modified portion.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A computer implemented method of designing a system at an architectural level, comprising the steps of:

generating through a plurality of design tasks a register transfer level (RTL) implementation of the system from an algorithmic description of the system; and branching from a first one of the plurality of design tasks to other ones of the plurality of design tasks, including ones of the plurality of design tasks executed prior to the first one of the plurality of design tasks, to execute the plurality of design tasks in different orders.

2. The method of claim 1 wherein each design task includes a plurality of design decisions and the step of branching includes interactively defining or modifying one of the plurality of design decisions within one of the plurality of design tasks and branching to another one of the plurality of design decisions within another one of the plurality of design tasks.

3. The method of claim 1 wherein the plurality of design tasks includes the steps of:

creating and editing the algorithmic description; and generating control-step mappings from the algorithmic description.

4. The method of claim 3 wherein the step of branching includes the steps of:

editing the algorithmic description after generating the control-step mappings from the algorithmic description; and re-generating the control-step mappings from only modified portions of the algorithmic description.

5. The method of claim 1 wherein the plurality of design tasks includes the steps of:

creating and editing the algorithmic description;

allocating RTL components; and generating structural mappings from the algorithmic description to the RTL components.

6. The method of claim 5 wherein the step of branching includes the steps of:

re-editing the algorithmic description; and re-generating the structural mappings from only modified portions of the algorithmic description.

7. The method of claim 1 wherein the plurality of design tasks includes the steps of:

allocating RTL components;

generating interconnect between the RTL components;

creating and editing the algorithmic description; and generating structural mappings from the algorithmic description to the RTL components and the interconnect.

8. The method of claim 7 wherein the step of branching includes the steps of:

re-generating at least some of the interconnect between the RTL components; and re-generating at least some of the structural mappings from the algorithmic description to the RTL components and the interconnect.

9. The method of claim 1 wherein the plurality of design tasks include the steps of:

allocating RTL components;

creating and editing the algorithmic description;

generating control-step mappings from the algorithmic description and the RTL components;

generating structural mappings from the algorithmic description to the RTL components; and generating interconnect between the RTL components.

10. The method of claim 1 wherein the plurality of design tasks includes a step of generating a control unit to enable RTL components of the RTL implementation for implementing the algorithmic description.

11. The method of claim 1, wherein the step of generating includes automatically executing at least one of the plurality of design tasks to produce RTL data representative of the RTL implementation.

12. The method of claim 11, further comprising a step of interactively editing the RTL implementation to override a portion of the RTL data produced by automatically executing said at least one of the plurality of design tasks.

13. A method of designing a system at an architectural level, comprising the steps of:

generating, through a plurality of design tasks where each of the plurality of design tasks includes a plurality of design decisions, a register transfer level (RTL) implementation of the system from an algorithmic description of the system; and interactively defining or modifying the plurality of design decisions within the plurality of design tasks at the architectural level of abstraction.

14. The method of claim 13 wherein the plurality of design tasks include the steps of:

allocating RTL components;

creating and editing the algorithmic description;

generating control-step mappings from the algorithmic description and the RTL components;

generating interconnect between RTL components; and generating structural mappings from the algorithmic description to the RTL components and the interconnect.

15. The method of claim 13 wherein the plurality of design tasks include a step of generating a control unit to enable the RTL components for implementing the algorithmic description.

16. The method of claim 13 wherein the step of interactively defining or modifying the plurality of design decisions includes the step of interactively assigning a control-step mapping to an element of the algorithmic description.

17. The method of claim 13 wherein the step of interactively defining or modifying the plurality of design decisions includes the step of interactively creating a structural mapping from an element in the algorithmic description to one of the RTL components.

18. The method of claim 13 wherein the step of interactively defining or modifying the plurality of design decisions includes the step of interactively allocating one of the RTL components.

19. The method of claim 13 wherein the step of interactively defining or modifying the plurality of design decisions includes the step of interactively creating a portion of the interconnect between the RTL components.

20. The method of claim 13 wherein the step of interactively defining or modifying the plurality of design decisions includes the step of interactively creating one element of the algorithmic description.

21. A method of designing an integrated circuit at an architectural level, comprising the steps of:

generating, through a plurality of design tasks where each of the plurality of design tasks includes a plurality of design decisions, a register transfer level (RTL) implementation of the integrated circuit from an algorithmic description of the integrated circuit;

arranging the algorithmic description of the integrated circuit in a graphical or textual format in a first display view;

arranging the RTL implementation of the integrated circuit in a graphical or textual format in a second display view; and wherein one of the plurality of design tasks includes the step of interactively mapping one element of the algorithmic description to one element of the RTL implementation of the integrated circuit from the first and second display views.

22. The method of claim 21 wherein the plurality of design tasks include the steps of:

allocating RTL components;

creating and editing the algorithmic description;

generating control-step mappings from the algorithmic description and the RTL components;

generating interconnect between the RTL components; and generating structural mappings from the algorithmic description to the RTL components and the interconnect.

23. A computing apparatus for designing a system at an architectural level, comprising:

means for generating through a plurality of design tasks a register transfer level (RTL) implementation of the system from an algorithmic description of the system; and means for branching from a first one of the plurality of design tasks to other ones of the plurality of design tasks, including ones of the plurality of design tasks executed prior to the first one of the plurality of design tasks, to execute the plurality of design tasks in different orders.

24. The computing apparatus of claim 23, wherein the means for generating includes:

means for creating and editing the algorithmic description; and means for generating control-step mappings from the algorithmic description.

25. The computing apparatus of claim 24 wherein the means for branching includes:

means for editing the algorithmic description after generating the control-step mappings from the algorithmic description; and means for re-generating the control-step mappings from only modified portions of the algorithmic description.

26. An integrated circuit designed according to the steps of:

generating, through a plurality of design tasks where each of the plurality of design tasks includes a plurality of design decisions, a register transfer level (RTL) implementation of the integrated circuit from an algorithmic description of the integrated circuit; and interactively defining or modifying the plurality of design decisions within the plurality of design tasks at the architectural level of abstraction.

27. The integrated circuit of claim 26, wherein the step of interactively defining or modifying the plurality of design decisions includes the step of interactively assigning a control-step mapping to an element of the algorithmic description.

28. The integrated circuit of claim 26 wherein the step of interactively defining or modifying the plurality of design decisions includes the step of interactively creating a structural mapping from an element in the algorithmic description to one of the RTL components.

29. The integrated circuit of claim 26 wherein the step of interactively defining or modifying the plurality of design decisions includes the step of interactively allocating one of the RTL components.

30. The integrated circuit of claim 26 wherein the step of interactively defining or modifying the plurality of design decisions includes the step of interactively creating a portion of the interconnect between the RTL components.

* * * * *